United States Patent
El Sabahy et al.

(10) Patent No.: US 11,705,484 B2
(45) Date of Patent: Jul. 18, 2023

(54) NANOWIRE STRUCTURE ENHANCED FOR STACK DEPOSITION

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Julien El Sabahy, Grenoble (FR); Frédéric Voiron, Barraux (FR); Paul-Henri Haumesser, Grenoble (FR); Pierre Noe, Grenoble (FR); Guy Parat, Grenoble (FR)

(73) Assignees: MURATA MANUFACTURING CO., LTD., Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 89 days.

(21) Appl. No.: 17/326,642

(22) Filed: May 21, 2021

(65) Prior Publication Data
US 2021/0280670 A1 Sep. 9, 2021

Related U.S. Application Data

(63) Continuation of application No. PCT/EP2019/082156, filed on Nov. 21, 2019.

(30) Foreign Application Priority Data

Nov. 23, 2018 (EP) .................................... 18306565

(51) Int. Cl.
*H01G 4/008* (2006.01)
*H01G 4/012* (2006.01)
(Continued)

(52) U.S. Cl.
CPC ............. *H01L 28/91* (2013.01); *H01G 4/008* (2013.01); *H01G 4/012* (2013.01); *H01G 4/33* (2013.01);
(Continued)

(58) Field of Classification Search
CPC ........ B82Y 10/00; B82Y 40/00; H01G 4/008; H01G 4/012; H01G 4/33
See application file for complete search history.

(56) References Cited

U.S. PATENT DOCUMENTS 8,168,495 B1  5/2012  Lim et al.
9,099,241 B1  8/2015  Zastrow et al.
(Continued)

FOREIGN PATENT DOCUMENTS

EP   2 980 014 A1   2/2016
WO   2015063420 A1  5/2015

OTHER PUBLICATIONS

International Search Report issued for PCT/EP2019/082156, dated Dec. 19, 2019.
(Continued)

*Primary Examiner* — Nathan Milakovich
(74) *Attorney, Agent, or Firm* — ArentFox Schiff LLP

(57) ABSTRACT

A nanowire structure that includes a conductive layer; conductive wires having first ends that contact the conductive layer and second ends that protrude from the conductive layer; and a lateral bridge layer that connects laterally a number of the conductive wires to provide a substantially uniform spacing between the conductive wires.

15 Claims, 12 Drawing Sheets

(51) Int. Cl.
  *H01G 4/33*  (2006.01)
  *B82Y 10/00* (2011.01)
  *B82Y 40/00* (2011.01)
  *H01L 49/02* (2006.01)

(52) U.S. Cl.
  CPC .............. *H01L 28/92* (2013.01); *B82Y 10/00*
           (2013.01); *B82Y 40/00* (2013.01)

(56) References Cited

U.S. PATENT DOCUMENTS

| | | |
|---|---|---|
| 11,316,006 B2 * | 4/2022 | Voiron ................... C25D 11/18 |
| 2005/0276743 A1 | 12/2005 | Lacombe et al. |
| 2013/0329337 A1 | 12/2013 | Masuda et al. |
| 2016/0032475 A1 | 2/2016 | Huyghebaert et al. |
| 2016/0233025 A1 * | 8/2016 | Masuda ................... H01G 4/06 |
| 2016/0268144 A1 | 9/2016 | Voiron et al. |
| 2022/0208968 A1 * | 6/2022 | El Sabahy ........ H01L 21/02603 |

OTHER PUBLICATIONS

Written Opinion of the International Searching Authority issued for PCT/EP2019/082156, dated Dec. 19, 2019.

H. Xing, et al.; "Fabrication of three dimensional interconnected porous carbons from branched anodic aluminum oxide template"; Electrochemistry Communications, vol. 13, No. 10, Jul. 6, 2011, pp. 1082-1085.

P. Banerjee, et al.; "Nanotubular metal-insulator-metal capacitor arrays for energy storage"; Nature Nanotechnology, vol. 4, May 2009, pp. 292-296.

* cited by examiner

AAO    MIM

NANOWIRE STRUCTURE ENHANCED FOR STACK DEPOSITION

CROSS REFERENCE TO RELATED APPLICATIONS

The present application is a continuation of International application No. PCT/EP2019/082156, filed Nov. 21, 2019, which claims priority to European Patent Application No. 18306565.5, filed Nov. 23, 2018, the entire contents of each of which are incorporated herein by reference.

FIELD OF THE INVENTION

The present invention relates to the field of integration and, more particularly, to electronic products, related semiconductor products, and their methods of manufacture.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. describe a metal-insulator-metal (MIM) structure formed in a porous anodic material, such as porous anodic alumina (AAO) for example. The successive layers of metal, insulator, and then metal follow the contours of the porous material resulting in the MIM structure being embedded inside the pores of the porous material. Banerjee's AAO embedded structure however suffers from high Equivalent Series Resistance (ESR) and limited capacitance density due to the AAO thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

Generally, AAO embedded structures as described above result from embedding a structure (e.g., a MIM structure) inside a porous region formed above a substrate, such as a silicon wafer. Typically, the porous region results from anodizing a thin layer of metal, such as aluminum, deposited above the substrate. The anodization converts the aluminum layer into porous anodic alumina. Typically, the porous region is formed with any shape (as viewed from the top) and extends across the alumina layer in a direction perpendicular to the wafer surface.

The MIM structure (or more generally Electrode-Insulator-Electrode (EIE) structure) is typically deposited inside the porous region using Atomic Layer Deposition (ALD). The ALD deposition process is sensitive to the permeability of the porous structure when the used reactive and reactant species are introduced as gas. FIG. 2 is an example scanning electron microscopy (SEM) image of an AAO embedded MIM structure. FIG. 3 is a magnification of FIG. 2 that highlights the MIM structure embedded in the AAO.

Various applications may benefit from the high integrated capacitance enabled by AAO embedded structures. For some applications, it is desired that the structure exhibits very low Equivalent Series Resistance (ESR) and Equivalent Series Inductance (ESL) and high Equivalent Capacitance Density (EPC). This is the case for example for capacitive elements used for decoupling processors. In this context, capacitors are used as a local energy tank (and thus placed very close to the processor) to compensate voltage drops caused by the power supply line impedance in the case of a large current swing. In today's processors, such current swings can be as large as 100 A. In the event of a current swing, the capacitor acts to provide the charges (i.e., current) required by the processor for the duration of the current swing. As the current provided by the capacitor passes through the internal capacitor resistance of the capacitor, the ESR of the structure should be as low as possible to minimize the voltage drop across the capacitor. For the same reason, the ESL of the capacitor also should be minimized. On the other hand, the larger the EPC is the larger can be the current swing event that is filtered by the capacitor (e.g., ~picosecond supply interruption for a ~nF capacitor, a nanosecond supply interruption for a µF capacitor, etc.).

To reduce ESR/ESL and increase EPC, in one implementation, two metallic collector plates are provided to short respectively the top and bottom electrodes of the EIE stack. As such, the EIE stack embedded in the porous region forms a parallel network of capacitors. As shown in FIG. 1, which illustrates an electrical circuit schematic of an AAO embedded EIE stack, each pore (including the embedded EIE) of the porous region can be represented by a resistor ($R_{pore}$) in series with a capacitance ($C_{pore}$). The overall structure couples the pores in parallel, resulting in a structure resistance equal to $R_{pore}$ divided by the number of pores and an structure capacitance equal to $C_{pore}$ multiplied by the number of pores.

Another approach as shown in WO 2015/063420 A1 stacks several layers of AAO embedded structures, provided that each layer has its own electrodes, interconnected in a parallel network. Larger capacitance and lower ESR/ESL can be achieved using this approach.

However, gas permeability limitations of the structure used in WO 2015/063420 A1 limit its performance in terms of ESR/ESL and EPC. Indeed, when nanometric porous structures are used to build capacitors, the deposition of the EIE stack is critical for final component performance. Specifically, the uniformity of the electrode layers (i.e., variation of the aspect ratio) has a direct influence on the ESR/ESL but also on the EPC if discontinuous. Further, the uniformity of the insulator layer is highly determinative for capacitor specific density as well as capacitor breakdown control. In the structure described in WO 2015/063420 A1, the nearly-closed porosity (where the gas can enter into the structure only through the pore openings) reduces permeability and results in a less homogenous EIE stack and, by consequence, a less homogeneous electrical performance. The deposition process is also slower due to an increased species diffusion time during ALD.

In general, EPC can be improved by adjusting the geometry of the AAO structure, specifically the pore geometry (pore diameter and pitch) and AAO thickness. However, these approaches have limitations as further discussed below.

FIG. 4 illustrates the effect of pore geometry (diameter and pitch) on the EPC of an AAO embedded capacitor structure, for various AAO thickness values. As shown, the EPC exhibits a maximum value for definite pore diameter and pitch values, irrespective of AAO thickness. Increases in AAO thickness increases the EPC as shown by lines 402, 404, and 406 corresponding respectively to AAO thicknesses of 15 μm, 10 μm, and 5 μm.

FIG. 5 illustrates the effect of pore diameter on the EPC of an AAO embedded capacitor structure. As shown, the EPC increases linearly with increases in pore diameter. In practice, however, an absolute limitation is imposed by the mechanical strength of the structure. Indeed, as the pore diameter is increased, the thickness of the AAO walls between adjacent pores decreases. At a certain pore diameter value, the structure becomes too brittle for practical implementations. For example, in the case of a porous AAO structure processed at 60 V, a theoretical limit in term of specific porosity is reached for a pore diameter of ~100 nm for a pitch of ~150 nm. Beyond this pore diameter, the AAO structure becomes too brittle to withstand stress induced during the EIE deposition process. This results in a limitation of capacitance density around 650 nF/mm$^2$ in the case of an EIE with an electrode thickness of ~15 nm and an insulator of ~10 nm of Alumina.

Once the pore diameter limit is reached, EPC can be further increased by increasing AAO thickness as shown in FIG. 4. However, increasing AAO thickness also increases the structure's ESR, as the length of electrodes increases with AAO thickness. Accordingly, increasing the EPC involves a tradeoff with maintaining an acceptable level of ESR and a pore geometry (diameter and pitch) that is adequate for the structure mechanical integrity.

The ESR of an AAO embedded structure may be decreased in certain cases. For example, in the implementation using collector plates to short respectively the top and bottom electrodes of the EIE stack, the ESR may be reduced by increasing the thickness of the collector plates. This is illustrated in FIG. 6, which is a plot of the ESR of an AAO embedded capacitor structure (y-axis) versus capacitor surface (x-axis). Line 602 is a best fit line for ESR measurements corresponding to a capacitor implementation using an upper current collector plate metallized with aluminum. Line 604 is a best fit line for ESR measurements corresponding to the same capacitor implementation but which further includes an NiAu layer above the aluminum layer. It is noted that the difference between lines 602 and 604 is due to the contribution of the contact resistance between the measurement probe and the current collector plate (in the case of aluminum only, a native oxide prevents good contact and thus direct measurement of the intrinsic ESR of the capacitor; in contrast, when NiAu is added the contact is nearly ideal and the measured ESR corresponds to the intrinsic ESR of the capacitor). The shown horizontal dashed line represents the ESR contribution of the collector plate to the global ESR.

As shown in FIG. 6, for large capacitors (e.g., >1 mm$^2$), the ESR of the structure is primarily due to the collector plates. The ESR may thus be reduced by increasing the thickness of the collector plates. But, as shown in FIG. 6, the ESR cannot be lowered below 30 mΩ in this example. However, for small capacitors (e.g., <1 mm$^2$), because the number of pores is too small, the collector plates make a negligible contribution towards the structure's ESR and the collector plates' thickness has a minimal effect on the ESR.

One way to decrease the ESR for small capacitors includes increasing the electrode thicknesses, thereby lowering the resistance of individual pores. However, this approach can be detrimental to the EPC as shown in FIG. 7, which illustrates the effect of the bottom electrode thickness on the EPC of an AAO embedded capacitor structure.

Specifically, FIG. 7 shows the EPC versus the Area Enhancement Factor of the structure. The Area Enhancement Factor is related to the ratio of 3D to 2D exposed surface (with the 3D exposed surface including the surface area of the pores and the 2D exposed surface being the top surface of the porous region) and is a function of pore diameter and pitch. In this example, line 702 represents the EPC for a bottom electrode thickness of 15 nm and line 704 represents the EPC for a bottom electrode thickness of 10 nm. The AAO, insulator layer, and top electrode thicknesses are 10 μm, 10 nm, and 10 nm, respectively, for both configurations. As shown, the EPC decreases significantly with the increase of the bottom electrode thickness.

Furthermore, increasing electrode thickness may increase mechanical stress within the structure. Specifically, in the case of a 15 nm thick TiN layer deposited by ALD, the intrinsic stress of the TiN layer can be as high as 1 GPa. This high intrinsic stress can cause cracks in the AAO to appear after electrode deposition. FIGS. 8A-8B are an optical microscopy image and an SEM image respectively of an AAO embedded capacitor structure showing a crack due to stress caused by high electrode thickness. The appearance of cracks lowers electrical yield and reduces reliability.

Accordingly, from an ESR point of view, a tradeoff exits between decreasing the ESR and not degrading the EPC and mechanical stress within the structure.

Alternative approaches to AAO embedded structures have been proposed. One approach includes using a nanowire structure instead of a porous structure as the deposition surface of EIE. One advantage of a nanowire structure can be its higher tolerance to stress buildup, particularly when the structure is sufficiently open to allow stress to dissipate in the interspace between the nanowires. With higher stress tolerance, both the ESR and the EPC can be improved further than in an AAO embedded structure (e.g., electrode thickness can be increased further to decrease ESR, interwire distance (equivalent to pore diameter) and/or wire depth (equivalent to AAO thickness) can be increased further to increase EPC).

Typically, the nanowire structure may be formed by growing nanowires of a conductive material within a template that localizes their growth (e.g., an AAO structure having pores). Various materials may be used for the conductive material, such as graphene, silicon, or copper, for example. The growth process may include deposition by sol-gel, Chemical Vapor Deposition (CVD), ALD, or other electrochemical techniques. After the growth of the nanowires, an etching process may be used to remove the template and release the nanowires.

However, conventional nanowire structures exhibit a limitation in terms of uniformity of the nanowires. Specifically, as shown in FIG. 9, an SEM image of a conventional nanowire structure, conventional structures suffer from the bundling of nanowires and occasionally the collapse of nanowires. These phenomena render the spacing between nanowires difficult to control and the nanowire structure less suited for controlled EIE deposition. EP 2 980 014 A1 (Huyghebaert) proposes a solution to this problem that involves forming two layers of nanowires on top of each other. One of the layers (the top layer in the case that the structure is used for EIE deposition) is designed to have interconnections between the nanowires. The interconnections are grown at the same time as the nanowires and are thus made of the same material as the nanowires. Huyghebaert recognizes a problem with coating the nanowires with the presence of the interconnections and therefore, to lessen this problem, teaches away from forming interconnections along both the top and bottom nanowire layers. This problem is exacerbated by the fact that Huyghebaert forms the nanowire cluster over the entire AAO template, which results in a less open structure. Further, Huyghebaert's process is not suited to forming an array of nanowire structures on a given substrate. Rather, Huyghebaert envisages forming a single nanowire structure over the entire substrate. From a practical point of view, this is not realistic unless a device (e.g., capacitor) of a unique size (i.e., the size of the substrate) is contemplated from the process. In other words, Huyghebaert's process does not allow for an array of nanowire structures that can be diced as desired to result in various device sizes. Any attempt of dicing through Huyghebaert's resulting structure would lead to dicing across conductive structure which would result in electrical failure.

Accordingly, there is a need for a conductive structure having a sufficiently regular geometry that is well suited for the controlled deposition of an EIE structure therein.

SUMMARY OF THE INVENTION

The present invention provides a structure, comprising: a first conductive layer; first conductive wires having first ends that contact the first conductive layer and second ends that protrude from the first conductive layer; and a first lateral bridge layer that connects laterally a number of the first conductive wires to provide a substantially uniform spacing between the first conductive wires.

By using a lateral bridge layer that connects laterally the first conductive wires, collapsing and/or bundling of the first conductive wires is reduced or eliminated. Substantially uniform spacing between the first conductive wires is thus achieved, rendering the structure highly favorable for a controlled deposition of a stacked structure, such as an Electrode-Insulator-Electrode (EIE) structure (e.g., MIM) or Insulator-Electrode (IE) structure, on top of the first conductive wires.

The first conductive wires may be of the same or a different material than the first conductive layer.

In an embodiment, the first lateral bridge layer comprises a capping layer that caps the second ends of at least some of the first conductive wires. The capping layer may be preferably of a conductor material, though an insulator material may also be used.

The capping layer may be of the same or a different material than the conductive wires. Using the same material may be beneficial from a process point of view by limiting process steps. The use of a different material may be beneficial in situations where a multi-stack structure is envisaged. In one embodiment, the capping layer may be of the same material as the first conductive layer. This allows the capping layer to serve as the "first conductive layer" of a subsequent structure formed on top of the structure. In one embodiment, the first conductive layer serves as an anodic etch stop layer of the structure and may be made of any material resistant to an anodization process used to form the structure. Similarly, the capping layer, made of the same material as the first conductive layer, would serve as the anodic etch stop layer of a subsequent structure built on top of the structure. This improves the capacitive density of the resulting structure.

In one embodiment, the capping layer is a continuous layer that caps the second ends of all or substantially all of the first conductive wires. The resulting structure remains open through its sides but exhibits high mechanical stability. This facilitates the EIE deposition process by providing both a highly regular geometry and high permeability to gases used during the EIE deposition process (e.g., ALD).

In another embodiment, the capping layer is a semi-continuous or discontinuous layer that caps the second ends of some, but not all, of the first conductive wires. In this configuration, adjacent ones of the first conductive wires may be capped together by the same portion of the capping layer. The resulting structure further enhances permeability to gases used during the EIE deposition process, but still ensures a sufficiently regular geometry for the EIE deposition.

In another embodiment, the first lateral bridge layer may comprise, alternatively or additionally to the capping layer, lateral extensions that connect laterally at least some of the first conductive wires via their outer walls. In one embodiment, the lateral extensions form a mesh-like lateral structure that connects together at least some of the first conductive wires.

Lateral extensions may be used together with a capping layer when a higher mechanical stability and a more regular geometry are needed for the EIE deposition process. On the other hand, when sufficiently high mechanical stability and regular geometry can be achieved using only the capping layer, then the lateral extensions may be omitted to further enhance gas permeability of the structure. This is because, in general, EIE deposition is easier using a capping layer than using lateral extensions.

The density of the mesh-like lateral structure may be controlled according to embodiments increasing or decreasing the number of lateral extensions, and consequently the number of connections between the first conductive wires. In one embodiment, the lateral extensions directly connect adjacent ones of the first conductive wires. In another embodiment, the lateral extensions may further directly connect non-adjacent ones of the first conductive wires.

In an embodiment, the first lateral bridge may comprise several mesh-like lateral structures, formed at various depths of the first conductive wires.

In an embodiment, where the structure includes a capping layer, the structure may further comprise: second conductive wires having first ends that contact the capping layer and second ends that protrude from the capping layer; and a second lateral bridge layer that connects laterally a number of the second conductive wires to provide a substantially uniform spacing between the second conductive wires.

As such, the structure may be a multi-stack structure, with each stack (i.e., conductive wires and associated lateral bridge layer) providing space for the deposition of an EIE structure therein. As a multiple of the number of layers, the specific capacitance density of the resulting structure is further increased.

The second lateral bridge may be similar to the first lateral bridge described above, for example the second lateral bridge may comprise a capping layer (continuous, semi-continuous, or discontinuous) that caps the second ends of at least some of the seconds ends of the second conductive wires and/or lateral extensions that connect laterally at least some of the second conductive wires via their outer walls. The second lateral bridge layer, like the first lateral bridge layer, reduces or eliminates the collapsing and/or bundling of the second conductive wires and results in a substantially uniform spacing between the second conductive wires. This makes the stack highly favorable for the deposition of an EIE stack on top of the second conductive wires.

In an embodiment, the structure may further comprise an EIE stack that coats the first conductive wires and/or the second conductive wires. The EIE stack forms a capacitance within the structure. In the EIE stack, the electrodes may be made of a conductor material or a combination of a conductor and an oxide. The insulator layer may be a dielectric, such as an ionic dielectric or a dielectric selected from the family of para-electric or ferro-electric materials.

In another embodiment, the first conductive wires (and/or the second conductive wires) provide a conductive electrode. As such, the first conductive wires (and/or the second conductive wires) may be coated by only an insulator layer and an electrode layer (IE stack), to provide an EIE stack.

In an embodiment, the structure may be formed on a substrate to provide a capacitor device. The substrate may embed other electronic or electro-optical components, which may or may not be electrically coupled to the capacitor device.

The EIE stack may be deposited using an ALD process. Structures according to the present invention are highly suited for such a deposition process as they exhibit greater gas permeability than conventional AAO or nanowire structures. Indeed, being open at least through their sides and having a more regular geometry, the proposed structures facilitate the diffusion of gases used in the deposition process. This aspect results in a reduction of process duration and cost.

The proposed structures also result in a lower ESR/ESL and a higher EPC compared to conventional AAO or nanowires structures. Specifically, with higher mechanical stability and stress tolerance due to the lateral bridge layer, both the ESR and the EPC can be improved further than in conventional structures (e.g., electrode thickness can be increased further to decrease ESR, inter-wire distance (equivalent to pore diameter) and/or wire depth (equivalent to AAO thickness) can be increased further to increase EPC).

In an embodiment, the structure may include an isolation sidewall that abuts and encloses laterally (from the sides) the first conductive wires. A similar isolation sidewall may be formed to surround the second conductive wires, when available. The isolation sidewall may be formed of an insulating material (polymer or oxide for example). The isolation sidewall creates an isolating wall around the structure and results in several advantages. First, using the isolation sidewall, the structure may be formed in a substrate housing an array of such structure. The structures of the array would be delimited by the isolation sidewall. Dicing of the array can be done along the isolation sidewalls. When the cut occurs along the isolation sidewall, the lateral side of the resulting structure is electrically insulated from the inner of the structure. In addition, the isolation sidewall acts as a stress buffer during the dicing process. Moreover, the isolation sidewall acts as a lateral passivation layer, sealing the structure and preventing infiltrations due to further processing steps after dicing (e.g., molding, soldering, etc.)

The present invention also provides a method of manufacturing an electronic product, comprising: forming an anodic etch stop layer on a substrate; forming an anodizable layer on the anodic etch stop layer; anodizing the anodizable layer to form an anodic oxide region having pores; forming, inside pores of the anodic oxide region, conductive wires having first ends that contact the anodic etch stop layer and second ends that protrude from the anodic etch stop layer; forming a lateral bridge layer that connects laterally a number of the conductive wires; and selectively dissolving the anodic oxide region.

In an embodiment, the anodizable layer is made of aluminum and the anodic oxide region is made of AAO.

In an embodiment, anodizing the anodizable layer comprises varying the anodization voltage to induce lateral porous branches in the anodic oxide that connect adjacent vertical pores.

In an embodiment, the lateral bridge layer may be formed within the created lateral porous branches. In one embodiment, forming the lateral bridge layer comprises forming lateral extensions, inside the lateral porous branches, the lateral extensions connecting laterally at least some of the conductive wires via their outer walls.

In an embodiment, the conductive wires and the lateral bridge layer are grown inside the pores and lateral porous branches of the anodic oxide region. Any deposition method suitable to grow a conductive material in a porous structure may be used, including, for example, an Electro-Chemical Deposition (ECD) or and electroless deposition process.

In another embodiment, forming the lateral bridge layer comprises forming, on a top surface of the anodic oxide region, a capping layer that caps the second ends of at least some of the conductive wires. The capping layer may be continuous, semi-continuous, or discontinuous and may cap all or substantially all or some of the second ends of the conductive wires. The capping layer may be preferably of a conductor material, though an insulator material may also be used. The capping layer may be of the same or a different material than the conductive wires. Using the same material may be beneficial from a process point of view by limiting process steps. The use of a different material may be beneficial in situations where a multi-stack structure is envisaged. In one embodiment, the capping layer may be of the same material as the anodic etch stop layer. This allows the capping layer to serve as the anodic etch stop layer of a subsequent structure formed on top of the structure.

In an embodiment, selectively dissolving the anodic oxide region comprises controlling a selective etching process of the anodic oxide region to reduce etching at the interface of the anodic etch stop layer and the conductive wires. In one embodiment, this is done by slowing down the etching process at the interface. This has the benefit of preventing or reducing electrochemical etching at the interface and results in the conductive wires being more uniform (less discontinuity and/or necking) particularly around the first ends that connect to the anodic etch stop layer.

In an embodiment, the method further comprises: depositing a first hard mask above the anodizable layer; patterning the first hard mask to define a section of the anodizable layer; and anodizing the section of the anodizable layer defined by the first hard mask to form the anodic oxide region.

The first hard mask helps localize the growth of the conductive wires within the section of the anodizable layer defined by the first hard mask.

The first hard mask may be an insulating material such as silicon oxide or silicon nitride.

In another embodiment, the method may further comprise: depositing a second hard mask on the anodic oxide region; patterning the second hard mask to define a section of the anodic oxide region; and forming the conductive wires inside pores of the anodic oxide region that fall within the section of the anodic oxide region defined by the second hard mask.

In an embodiment, the section of the anodic oxide region defined by the second hard mask corresponds to a section with pores that are fully open.

The second hard mask may be an insulating material such as silicon oxide or silicon nitride.

In an embodiment, the second hard mask is etched prior to or lifted off during the dissolution of the anodic oxide region. This facilitates the dissolution of the anodic oxide region. The use of the second hard mask also eases the deposition of the EIE stack as gas penetration into the structure is facilitated. Specifically, the use and subsequent removal of the second hard mask results in the structure being completely open from the sides prior to EIE deposition.

In an embodiment, the method may further comprise forming an isolation sidewall that abuts and encloses laterally the conductive wires. This may include dissolving a section of the anodic oxide region that surrounds the conductive wires, the anodic oxide region being free of conductive wires in the dissolved section; and forming the isolation sidewall inside a volume previously occupied by the dissolved section of the anodic oxide region.

In an embodiment, the section of the anodic oxide region that surrounds the conductive wires includes pores that do not fully extend to the anodic etch stop layer (1308) at the time that section is dissolved.

In another embodiment, the method further comprises forming an EIE or IE stack on the conductive wires. The EIE or IE stack may be deposited using an ALD process. The EIE or IE stack forms a capacitance within the structure.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention address the existing deficiencies of the prior art by providing nanowire structures with highly regular geometry. Being also highly open, the proposed structures are well-suited for EIE deposition but also maintain the advantages of nanowire structures, in terms of higher stress tolerance, and consequently improved ESR/ESL and EPC.

Figure 1:
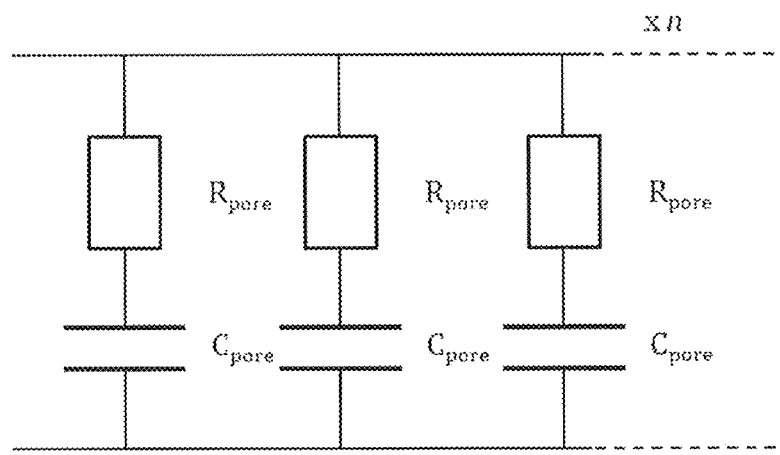
FIG. 1 is an electrical circuit schematic of an anodized alumina (AAO) embedded capacitor structure.
Figure 2:
FIG. 2 is an example scanning electron microscopy (SEM) image of an AAO embedded capacitor structure.
Figure 3:
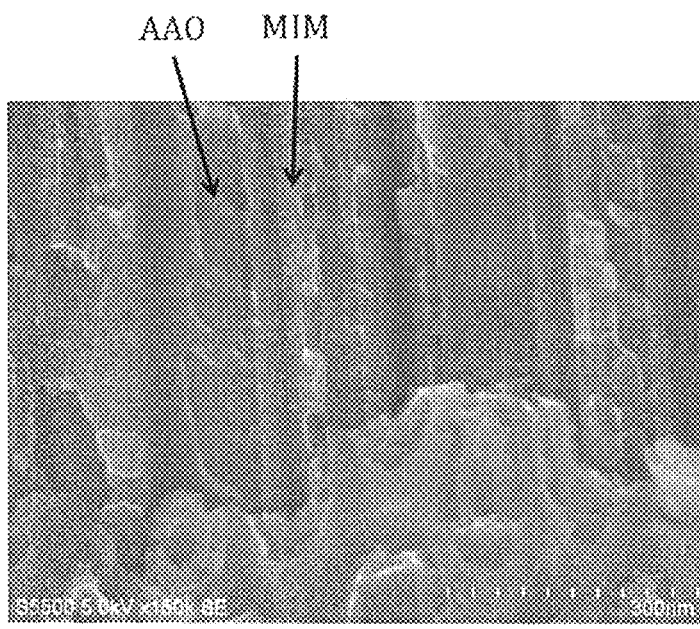
FIG. 3 is a magnification of FIG. 2 that highlights a Metal-Insulator-Metal (MIM) structure embedded in the AAO.
Figure 4:
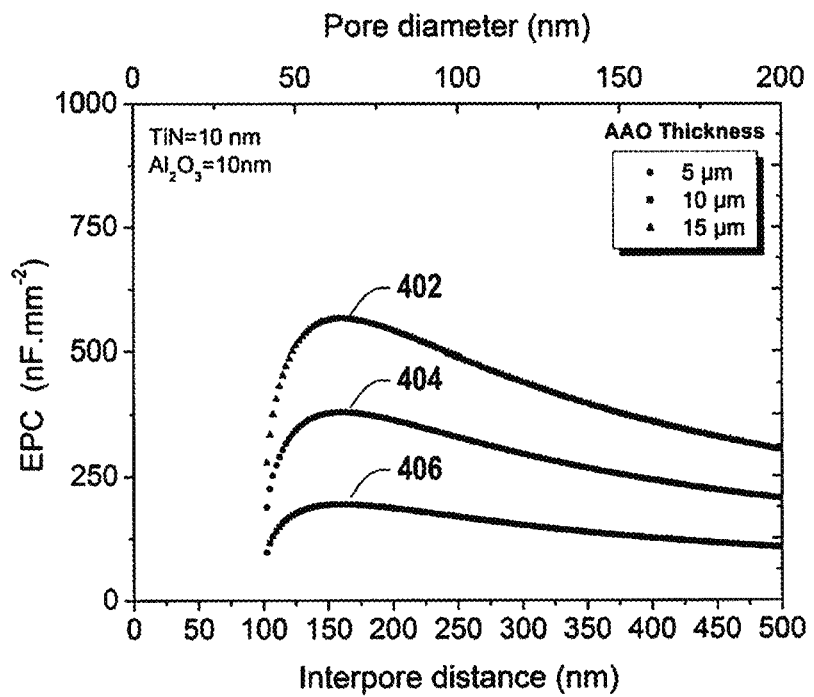
FIG. 4 illustrates the effect of pore geometry (diameter and pitch) on the Equivalent Capacitance Density (EPC) of an AAO embedded capacitor structure, for various AAO thickness values.
Figure 5:
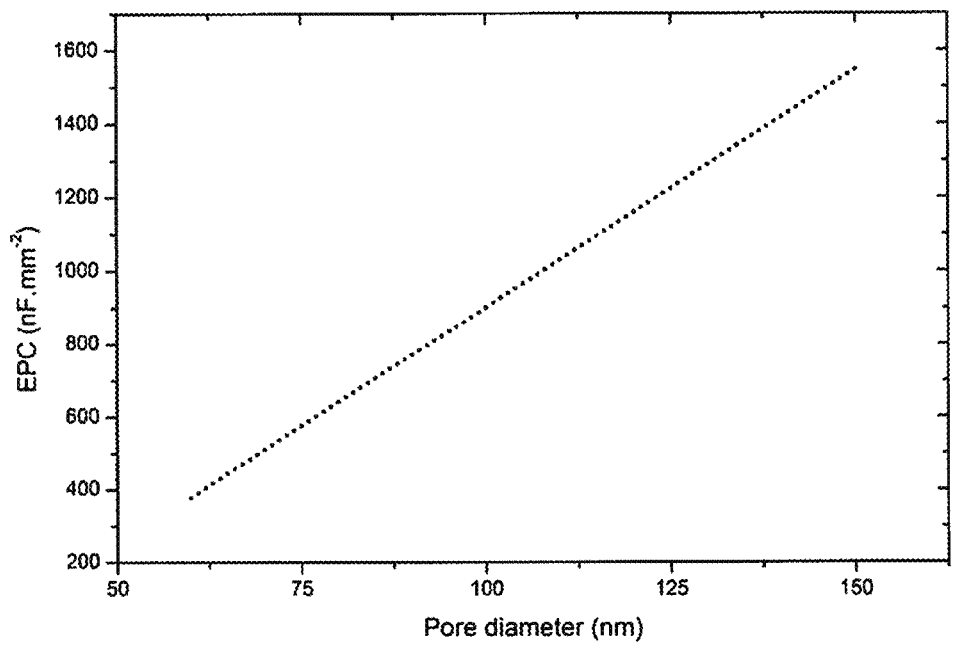
FIG. 5 illustrates the effect of pore diameter on the EPC of an AAO embedded capacitor structure.
Figure 6:
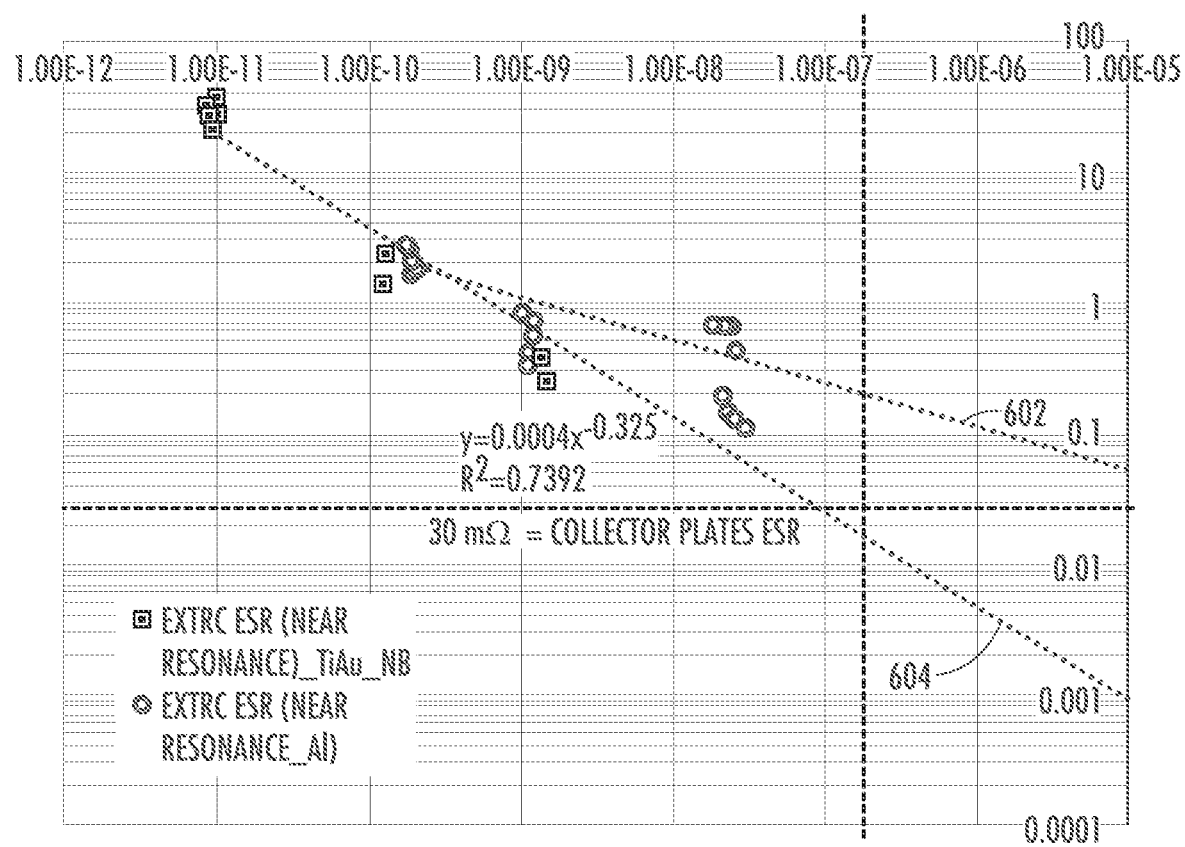
FIG. 6 is a plot of the Equivalent Series Resistance (ESR) of an AAO embedded capacitor structure versus capacitor surface.
Figure 7:
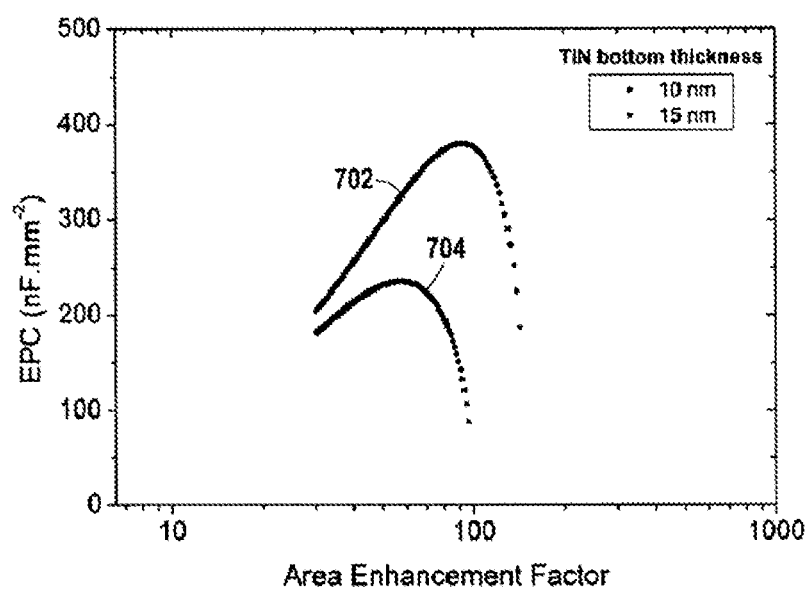
FIG. 7 illustrates the effect of bottom electrode thickness on the EPC of an AAO embedded capacitor structure.
Figure 8A:
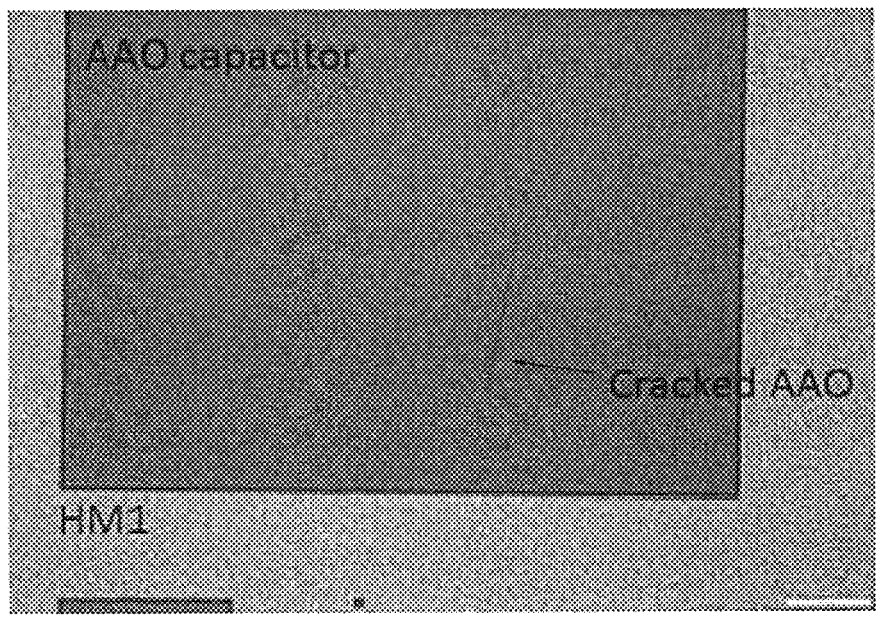
FIGS. 8A-8B are an optical microscopy image and an SEM image respectively of an AAO embedded capacitor structure showing a crack due to stress caused by high electrode thickness.
Figure 8B:
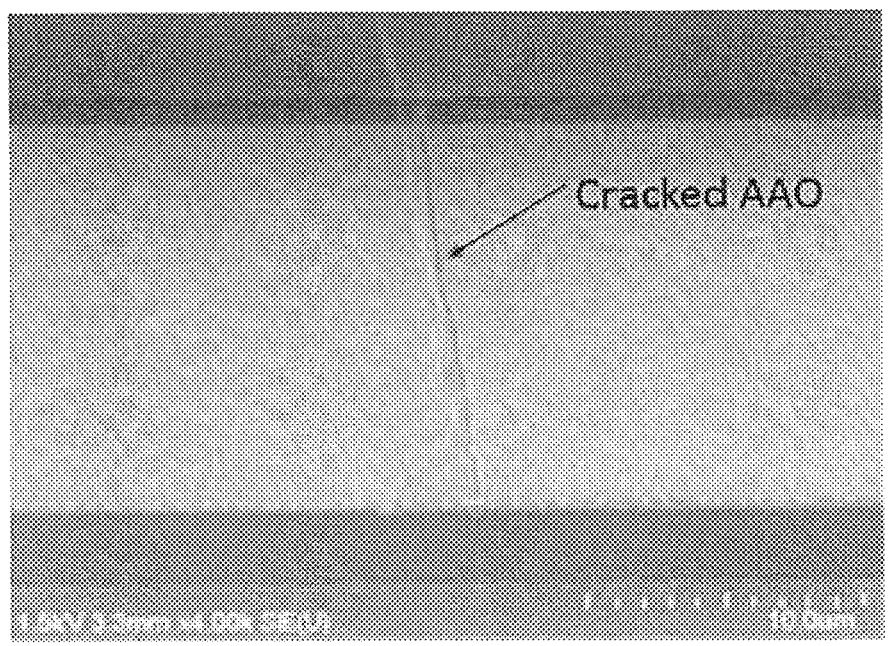
Figure 9:
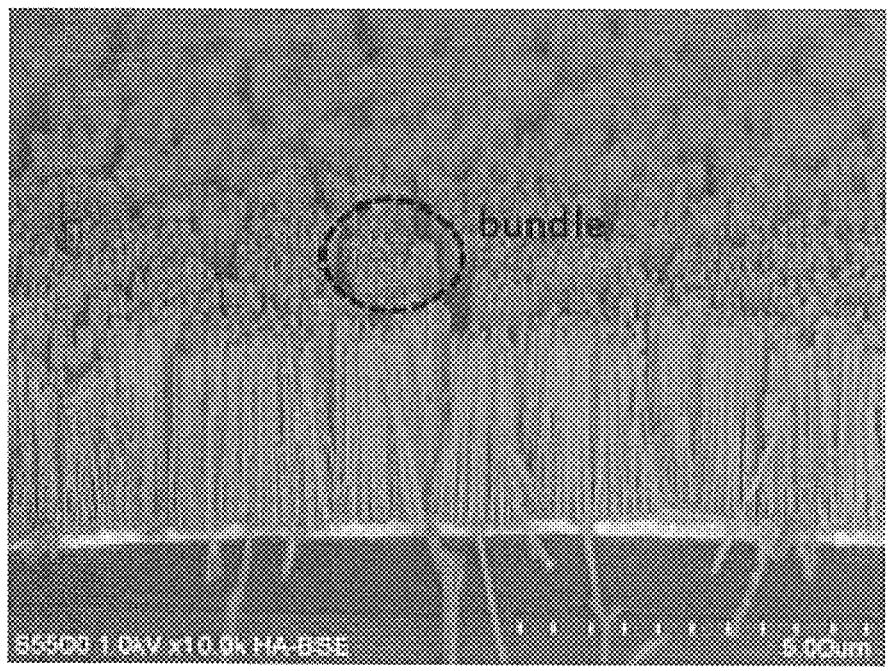
FIG. 9 is an SEM image of a conventional nanowire structure.
Figure 10:
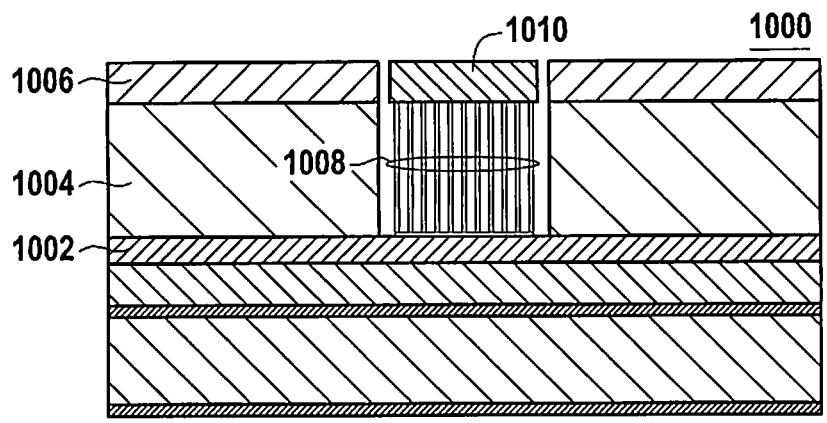
FIG. 10 illustrates a cross-section view of an example structure according to an embodiment of the present invention.

FIG. 10 illustrates a cross-section view of an example structure 1000 according to an embodiment of the present invention. As shown in FIG. 10, example structure 1000 includes a first conductive layer 1002; first conductive wires 1008 having first ends that contact the first conductive layer 1002 and second ends that protrude from the first conductive layer 1002; and a first lateral bridge layer (1010 in FIG. 10) that connects laterally a number of the first conductive wires 1008 to provide a substantially uniform spacing between the first conductive wires 1008. The first conductive wires 1008 may be of a different material than the first conductive layer 1002.

In an embodiment, as shown in FIG. 10, the first conductive layer 1002 is an anodic etch stop layer that is formed on a substrate. The first conductive wires 1008 may be grown within a sacrificial AAO template (not shown in FIG. 10) which is partially or fully removed after the growth of the first conductive wires 1008. The AAO template may be formed by anodizing a layer 1004 made of aluminum. A hard mask layer 1006 may be formed on the layer 1004 before the anodization to define the sacrificial AAO template in which the first conductive wires 1008 are grown.

The first conductive layer 1002 may have several functions which govern its properties. In an embodiment, the first conductive layer 1002 serves to prevent the progression of anodization into an aluminum electrical contact layer underlying the first conductive layer 1002. Specifically, during the anodization, the portions of the first conductive layer 1002 exposed to the anodization process form an oxide top surface. To remove this oxide top surface and ensure electrical contact through the first conductive layer 1002 to the electrical contact layer, the first conductive layer 1002 is selected such that an oxide thereof can be selectively etched relative to the surrounding AAO template. Additionally, the first conductive layer 1002 may be selected to reduce the contact resistance through the layer for improved ESR performance. In another embodiment, the first conductive layer 1002 may be required to sufficiently pass an electric current provided through the layer 1002 to conduct an electroplating process for forming the first conductive wires 1008.

By using a lateral bridge layer that connects laterally the first conductive wires 1008, collapsing and/or bundling of the first conductive wires 1008 is reduced or eliminated. Substantially uniform spacing between the first conductive wires 1008 is thus achieved, rendering the structure 1000 highly favorable for a controlled deposition of a stacked structure, such as an EIE structure, on top of the first conductive wires 1008.

In an embodiment, the first lateral bridge layer comprises a capping layer that caps the second ends of at least some of the first conductive wires 1008. The capping layer may be of a conductor or an insulator material. When the capping layer is conductive, it may be of the same or a different material than the conductive wires 1008. In one embodiment, the capping layer may be of the same material as the first conductive layer 1002 (e.g., tungsten).

In one embodiment, as shown in FIG. 10, the capping layer is a continuous layer 1010 that caps the second ends of all or substantially all of the first conductive wires 1008. The resulting structure remains open through its sides but exhibits high mechanical stability. This facilitates the EIE deposition process by providing both a highly regular geometry and high permeability to gases used during the EIE deposition process (e.g., ALD).

Figure 12A:
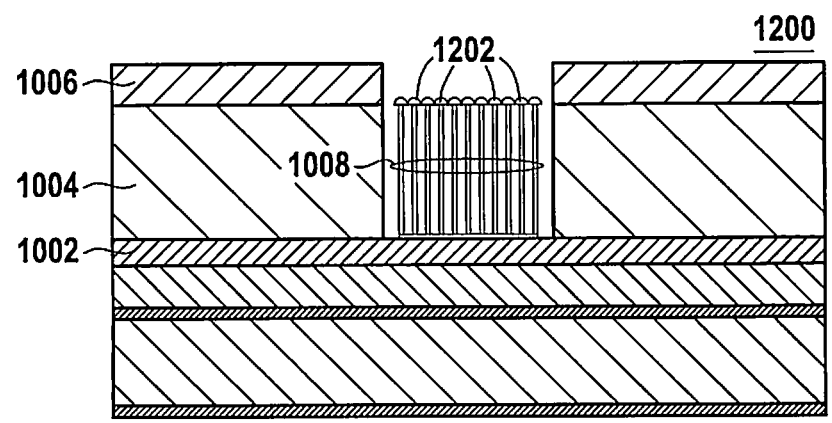
FIGS. 12A-12B illustrate a cross-section view and a top view respectively of another example structure according to an embodiment of the present invention.
Figure 12B:
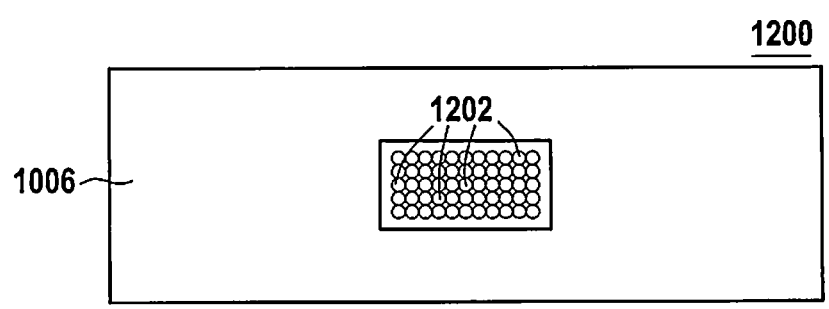

In another embodiment, shown in a cross-section view and a top view in FIGS. 12A and 12B, the capping layer may be a semi-continuous or discontinuous layer 1202 that caps the second ends of some, but not all, of the first conductive wires 1008. In this configuration, adjacent ones of the first conductive wires 1008 may be capped together by the same portion of the capping layer 1202. The resulting structure 1200 further enhances permeability to gases used during the EIE deposition process, but still ensures a sufficiently regular geometry for the EIE deposition.

Figure 11:
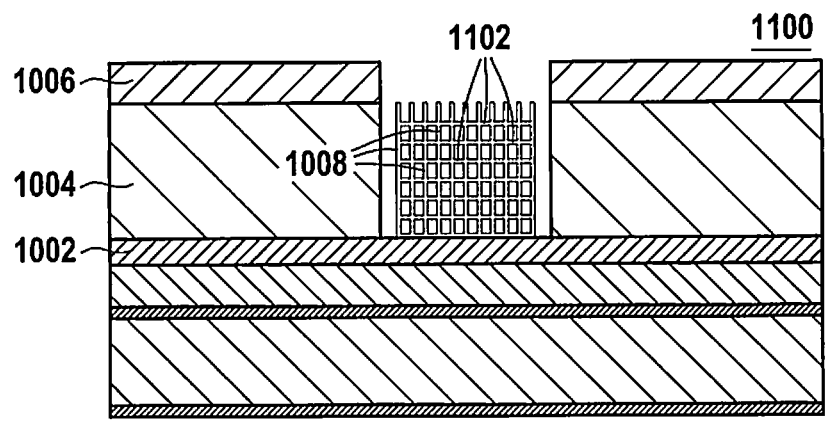
FIG. 11 illustrates a cross-section view of another example structure according to an embodiment of the present invention.

In another embodiment, shown in FIG. 11, the first lateral bridge layer may comprise lateral extensions 1102 that connect laterally at least some of the first conductive wires 1008 via their outer walls. In an embodiment, the lateral extensions 1102 are formed within lateral porous branches created within the AAO template by varying the anodization voltage (voltage swinging) during anodization. It is noted that, depending on the process used to form them, lateral extensions may or may not have a well-defined geometry. In a voltage swinging process, the formed lateral extensions generally do not have a controlled, well-defined geometry (e.g., cylindrical).

In one embodiment, the lateral extensions 1102 form a mesh-like lateral structure that connects together at least some of the first conductive wires 1008. The density of the mesh-like lateral structure may be controlled according to embodiments increasing or decreasing the number of lateral extensions 1102, and consequently the number of connections between the first conductive wires 1008. In one embodiment, the lateral extensions 1102 directly connect adjacent ones of the first conductive wires 1008. In another embodiment, the lateral extensions 1102 may further directly connect non-adjacent ones of the first conductive wires 1008.

As shown in FIG. 11, the lateral extensions 1102 may be provided to form several mesh-like lateral structures, formed at various depths of the first conductive wires 1008. In other embodiments, however, a single mesh-like lateral structure may be provided at substantially a single depth of the first conductive wires 1008.

As would be understood by a person of skill in the art based on the teachings herein, the first lateral bridge layer may comprise any combination of lateral bridge layer types. For example, lateral extensions 1102 may be used together with a capping layer (continuous, semi-continuous, or discontinuous) when a higher mechanical stability and a more regular geometry are needed for the EIE deposition process. On the other hand, when sufficiently high mechanical stability and regular geometry can be achieved using only the capping layer, then the lateral extensions 1102 may be omitted to further enhance gas permeability of the structure.

Figure 19:
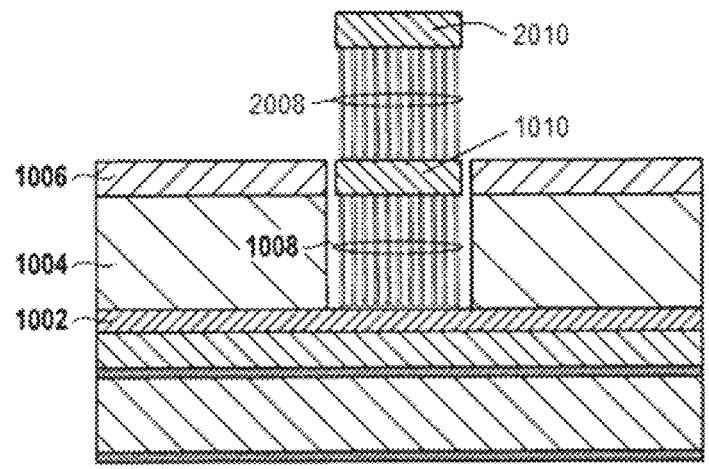
FIG. 19 illustrates a cross-section view of an example structure according to a further embodiment of the present invention.

In an embodiment shown in FIG. 19, where the structure includes a capping layer 1010, the structure may further comprise second conductive wires 2008 having first ends that contact the capping layer 1010 and second ends that protrude from the capping layer 1010; and a second lateral bridge layer 2010 that connects laterally a number of the second conductive wires 2008 to provide a substantially uniform spacing between the second conductive wires 2008. As such, the structure may be a multi-stack structure, with each stack (i.e., conductive wires and associated lateral bridge layer) providing space for the deposition of an EIE structure therein. As a multiple of the number of layers, the equivalent capacitance density of the resulting structure is further increased.

The second lateral bridge 2010 may be similar to the first lateral bridge 1010 described above, for example the second lateral bridge 2010 may comprise a capping layer (continuous, semi-continuous, or discontinuous) that caps the second ends of at least some of the seconds ends of the second conductive wires 2008 and/or lateral extensions that connect laterally at least some of the second conductive wires 2008 via their outer walls. The second lateral bridge layer 2010, like the first lateral bridge layer 1010, reduces or eliminates the collapsing and/or bundling of the second conductive wires 2008 and results in a substantially uniform spacing between the second conductive wires 2008. This makes the stack highly favorable for the deposition of an EIE stack on top of the second conductive wires 2008.

As would be understood by a person of skill in the art based on the teachings herein, the multi-stack structure may include more than two stacks.

In an embodiment, the proposed structure may further comprise an EIE stack (not shown in FIGS. 10, 11, and 12A-B) that coats the first conductive wires 1008 and/or the second conductive wires. The EIE stack forms a capacitance within the structure. In the EIE stack, the electrodes may be made of a conductor material or a combination of a conductor and an oxide. The insulator layer may be a dielectric, such as an ionic dielectric or a dielectric selected from the family of para-electric or ferro-electric materials.

Figure 18:
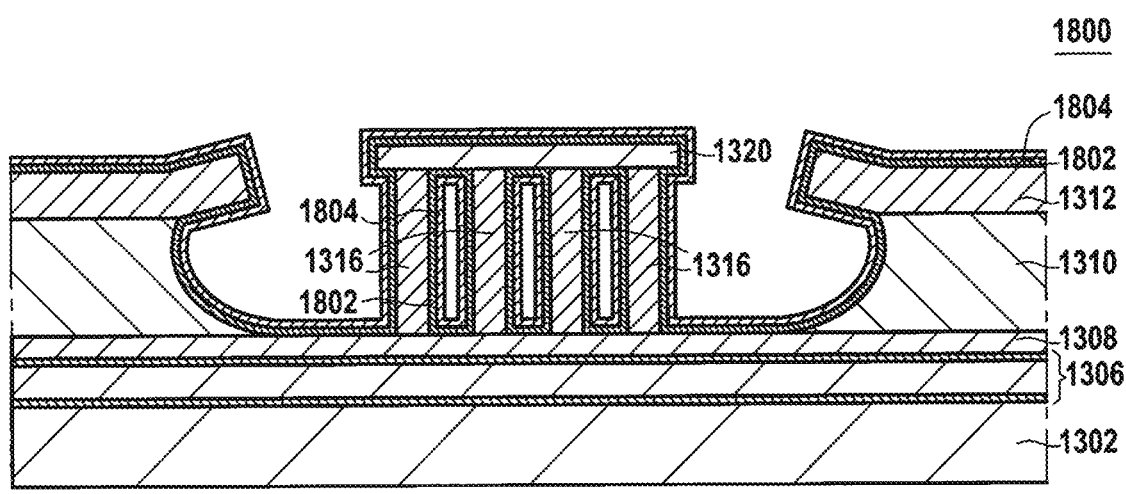
FIG. 18 illustrates an example structure according to an embodiment of the present invention.

In another embodiment, the first conductive wires 1008 (and/or the second conductive wires) provide a conductive electrode. As such, the first conductive wires 1008 (and/or the second conductive wires) may be coated by only an insulator layer and an electrode layer, to provide an EIE stack. An example of such a structure is shown in FIG. 18 which illustrates a structure 1800 having an IE stack that coats the first conductive wires.

The EIE stack may be deposited using an ALD process. Structures according to the present invention are highly suited for such a deposition process as they exhibit greater gas permeability than conventional AAO or nanowire structures. Indeed, as shown in FIGS. 10, 11, and 12A-B, being open at least through their sides and having a more regular geometry, the proposed structures facilitate the diffusion of gases used in the deposition process. This aspect results in a reduction of process duration and cost.

Figure 16:
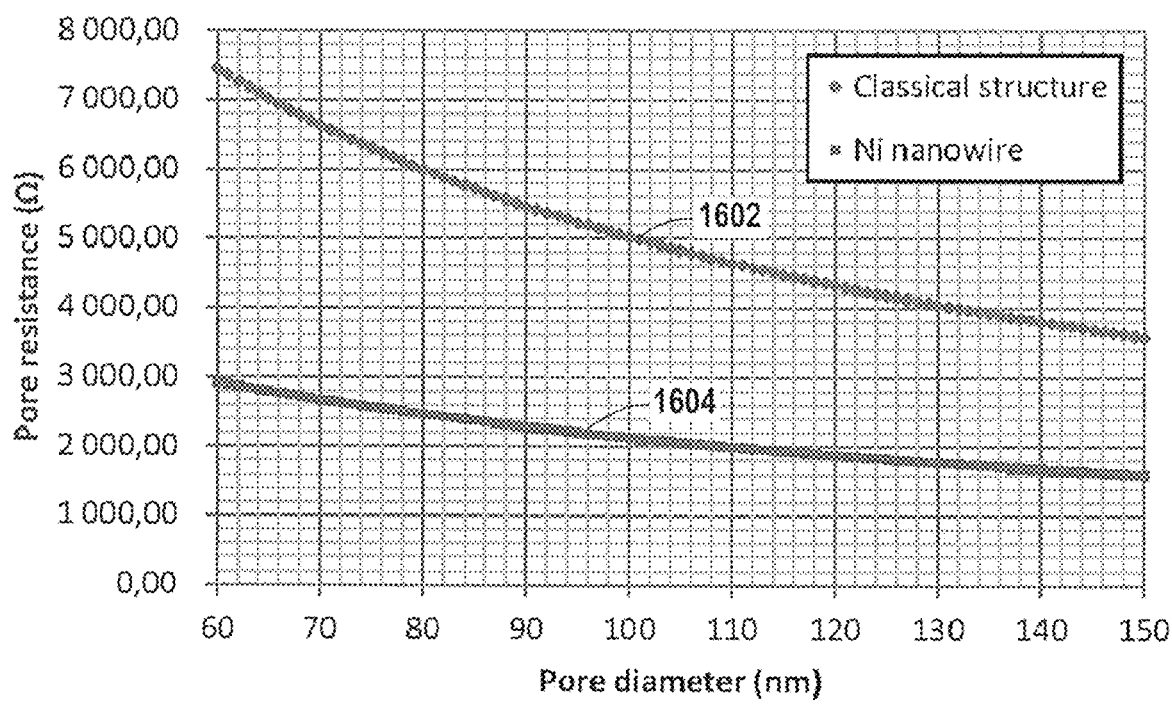
FIG. 16 is graph illustrating the ESR performance of an example structure according to an embodiment of the present invention compared to a conventional AAO embedded structure.

Additionally, the proposed structures result in a lower ESR/ESL and a higher EPC compared to conventional AAO or nanowires structures. Specifically, with higher mechanical stability and stress tolerance due to the lateral bridge layer, both the ESR and the EPC can be improved further than in conventional structures (e.g., electrode thickness can be increased further to decrease ESR, inter-wire distance (equivalent to pore diameter) and/or wire depth (equivalent to AAO thickness) can be increased further to increase EPC). For the purpose of illustration, FIG. 16 illustrates the ESR performance of an example structure according to an embodiment of the present invention compared to a conventional AAO embedded structure. Specifically, FIG. 16 shows a comparison of the resistance of a MIM stack in a single pore of an AAO embedded structure (line 1602) versus the resistance of the same MIM stack deposited on a nanowire of the example structure of the present invention (line 1604). As shown, the resistance is substantially decreased on a per-pore (nanowire) basis, particularly for smaller pore diameter values. This reduction may be due, among other reasons, to the nanowire acting as a lower resistance electrode.

FIGS. 13A-13G illustrate steps of a process for manufacturing an electronic product, including a structure in accordance with embodiments of the present invention.

Figure 13A:
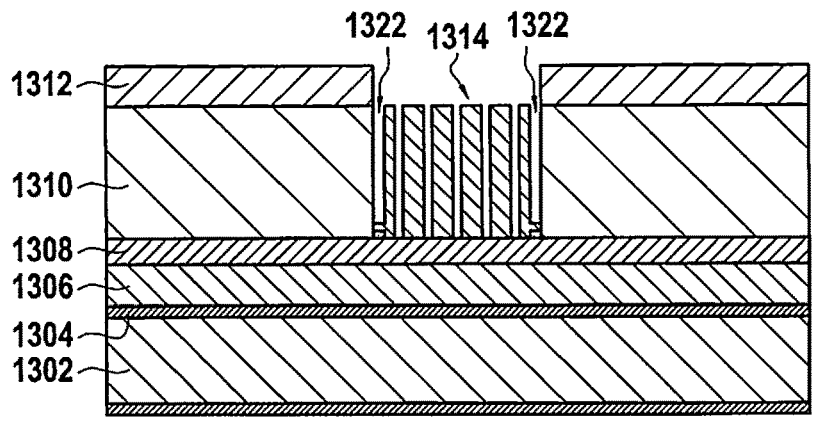
FIGS. 13A-13G illustrate process steps for producing structures according to embodiments of the present invention.

For the purpose of simplification, description begins with reference to FIG. 13A which illustrates an intermediate product resulting after the formation of a porous region over a substrate. In an example embodiment, the fabrication of the intermediate product includes forming an anodic etch stop layer 1308 on a substrate; forming an anodizable layer 1310 on the anodic etch stop layer 1308; and anodizing the anodizable layer 1310 to form an anodic oxide region 1314 having pores. The anodic oxide region 1314 may include unopened pores 1322 (i.e., pores that do not extend all the way to the anodic etch stop layer 1308).

In an example embodiment, the substrate may be a silicon-on-insulator substrate including a silicon layer 1304 and an insulator layer 1302, formed on a base substrate. However, embodiments are not limited to this example embodiment.

In an example embodiment, a metal layer 1306 is formed between silicon layer 1304 of the substrate and the anodic etch stop layer 1308. The metal layer 1306 may be made of aluminum, copper (Cu), silver (Ag), or aluminum copper (AlCu) combined or not with barrier metals such as titanium, titanium nitride, tantalum, tantalum nitride. In an embodiment, the metal layer 1306 serves as a bottom electrode for a capacitor device embedded into the structure.

In an embodiment, the anodizable layer 1310 is made of aluminum and the anodic oxide region 1314 is made of AAO.

The anodic etch stop layer 1308 may be made of any material resistant to the anodization process. For example, the anodic etch stop layer 1308 may be made of tungsten.

In forming the anodic oxide region 314, it may be desirable for some applications to have the resulting porous region embedded within the anodizable layer 1310. For example, it may be desirable to control the size of the resulting porous region in order to control the size and capacitance of a capacitive structure that will be embedded therein. Typically, as shown in FIG. 13A, this is achieved by forming a first hard mask 1312 on top of the anodizable layer 1310 to mask the area of the anodizable layer 1310 that is not intended to be anodized. Specifically, the process includes depositing the first hard mask 1312 above the anodizable layer 1310; patterning the first hard mask 1312 to define a section of the anodizable layer 1310; and anodizing the section of the anodizable layer defined by the first hard mask 1312 to form the anodic oxide region 1314. The masking shields the anodizable layer 1310, except the section defined by the first hard mask 1312, from contact with the anodization electrolyte, and the porous region is thus formed in the area(s) of the anodizable layer 1310 where the first hard mask 1312 is open.

The first hard mask may be an insulating material, such as silicon oxide or silicon nitride, or a metal provided that the metal forms a stable oxide when exposed to the anodization electrolyte.

In another embodiment, the anodic oxide region 314 may be allowed to extend over the entire surface of the substrate, except for the area where the anodic voltage is set during anodization. In such embodiment, no hard mask is used.

Figure 13B:
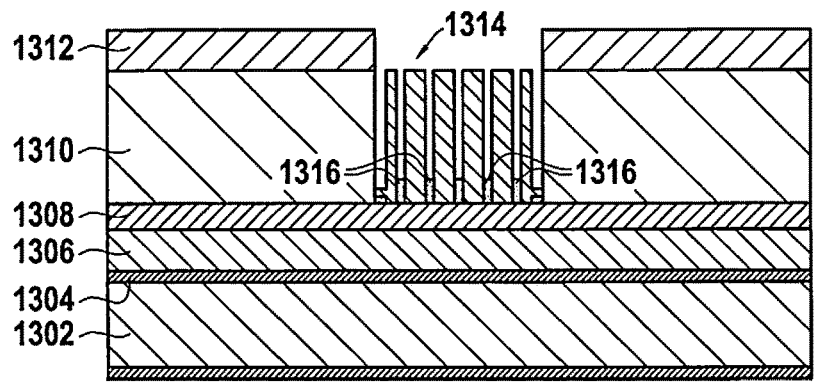
Figure 13C:
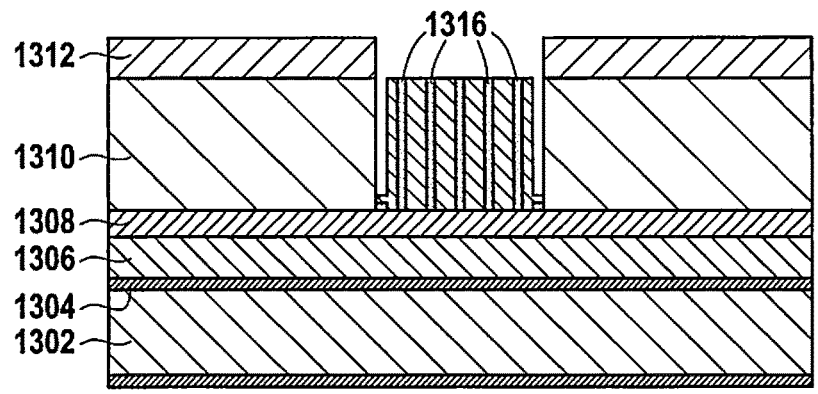

After formation of the anodic oxide region 1314, the process, as illustrated in FIGS. 13B and 13C, includes forming, inside pores of the anodic oxide region 1314, conductive wires 1316 having first ends that contact the anodic etch stop layer 1308 and second ends that protrude from the anodic etch stop layer 1308.

The conductive wires 1316 may be grown inside the pores of the anodic oxide region 1314. Any deposition method suitable to grow a conductive material in a porous structure may be used, including, for example, an Electro-Chemical Deposition (ECD) or an electroless deposition process. In an embodiment, an electrodeposition process is preferred. Various materials may be used for the conductive material, such as nickel, graphene, silicon, or copper, for example.

In an embodiment, unopened pores 1322 of the anodic oxide region 1314 are avoided and no conductive wires are formed therein. Specifically, in an embodiment, the process includes depositing a second hard mask (not shown) on the anodic oxide region 1314 (or on the first hard mask 1312 if still present); patterning the second hard mask to define a section of the anodic oxide region 1314; and forming the conductive wires 1316 inside pores of the anodic oxide region 1314 that fall within the section defined by the second hard mask. In an embodiment, the section of the anodic oxide region 1314 defined by the second hard mask corresponds to a section with pores that are fully open. The second hard mask may be an insulating material such as silicon oxide or silicon nitride.

Subsequently or concurrently with forming the conductive wires 1316, the process includes forming a lateral bridge layer that connects laterally a number of the conductive wires 1316.

Figure 13D:
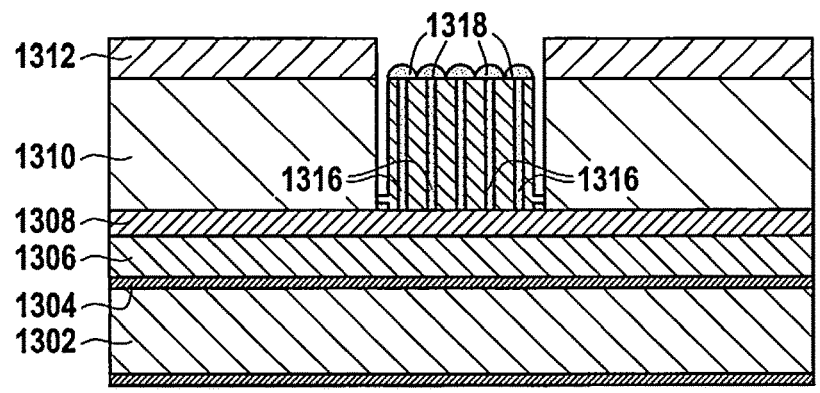
Figure 13E:
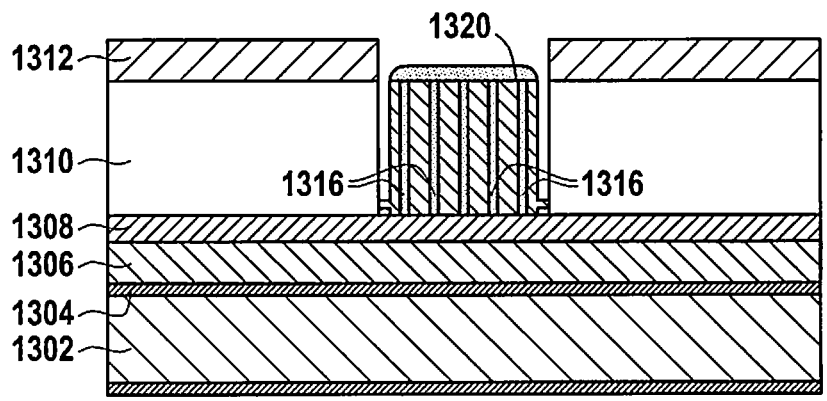

In an embodiment, forming the lateral bridge layer comprises forming, on a top surface of the anodic oxide region 1314, a capping layer that caps the second ends of at least some of the conductive wires 1316. The capping layer may be continuous, semi-continuous, or discontinuous and may cap all or substantially all or some of the second ends of the conductive wires 1316. FIG. 13D illustrates a structure with a semi-continuous capping layer 1318 that partially caps the conductive wires 1316. FIG. 13E illustrates the same structure with a continuous capping layer 1320 that caps all or substantially all of the conductive wires 1316.

In another embodiment (not shown in FIGS. 13A-G), forming the lateral bridge layer includes, alternatively or additionally to forming a capping layer, forming lateral extensions, inside lateral porous branches of the anodic oxide region 1314, the lateral extensions connecting laterally at least some of the conductive wires 1316 via their outer walls. In accordance with this embodiment, the anodization of the anodizable layer 1310 comprises varying the anodization voltage to induce lateral porous branches in the anodic oxide that connects adjacent vertical pores. The lateral extensions may be formed by the same deposition process forming concurrently the conductive wires 1316.

Figure 13F:
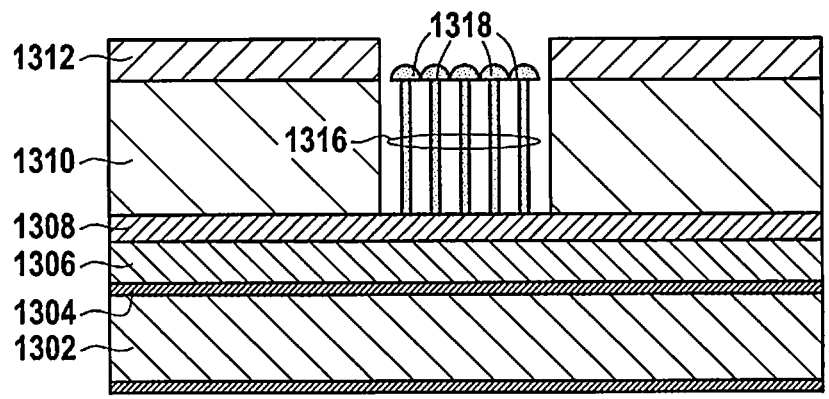

Once the conductive wires 1316 and the lateral bridge layer are formed, the anodic oxide region 1314 may be selectively (partially or fully) dissolved. As such, the anodic oxide region 1314 acts as a sacrificial template to enable an ordered formation of the conductive wires 1316. The resulting structure is shown in FIGS. 13F (partial capping) and 13G (continuous capping). In an embodiment, selectively dissolving the anodic oxide region 1312 comprises controlling a selective etching process of the anodic oxide region 1312 to reduce etching at the interface of the anodic etch stop layer 1308 and the conductive wires 1316. In one embodiment, this is done by slowing down the etching process at the interface. This has the benefit of preventing or reducing electrochemical etching at the interface and results in the conductive wires 1316 being more uniform (less discontinuity and/or necking) particularly around the first ends that connect to the anodic etch stop layer 1308.

In another embodiment, the process may further comprise forming an EIE or IE stack on the conductive wires 1316. The EIE or IE stack may be deposited using an ALD process. The EIE or IE (together with the conductive wires 1316) stack forms a capacitance within the structure. FIG. 18 illustrates an example structure 1800 that results from forming an IE stack on the structure shown in FIG. 13G. As shown, the IE stack including an insulator layer 1802 and an electrode layer 1804. In an embodiment, the IE stack is formed after removal of the second hard mask and dissolution of the anodic oxide region. As such, the IE stack may coat the first hard mask 1312, the capping layer 1320, the conductive wires 1316 all along their outer walls, and a trench (further discussed below) that results from dissolution of the anodic oxide region. In another embodiment, the IE stack may be designed to coat only the conductive wires 1316 or only the conductive wires 1316 and the capping layer 1320. As would be understood by a person of skill in the art based on the teaching herein, embodiments are not limited to structure 1800 having a continuous capping layer 1320. In other embodiments, capping layer 1320 may be replaced with a discontinuous capping layer, a semi-continuous capping layer (e.g., 1318), or lateral extensions (e.g., 1102).

In an embodiment, where a second mask is used to cover unopened pores of the anodic oxide region, the second hard mask is etched prior to or lifted off during the dissolution of the anodic oxide region. This facilitates the dissolution of the anodic oxide region. The removal of the second hard mask also eases the deposition of the EIE stack as it facilitates gas penetration into the structure. Specifically, as further discussed below, the use and subsequent removal of the second hard mask results in the structure being completely open from the sides prior to EIE deposition.

Figure 17:
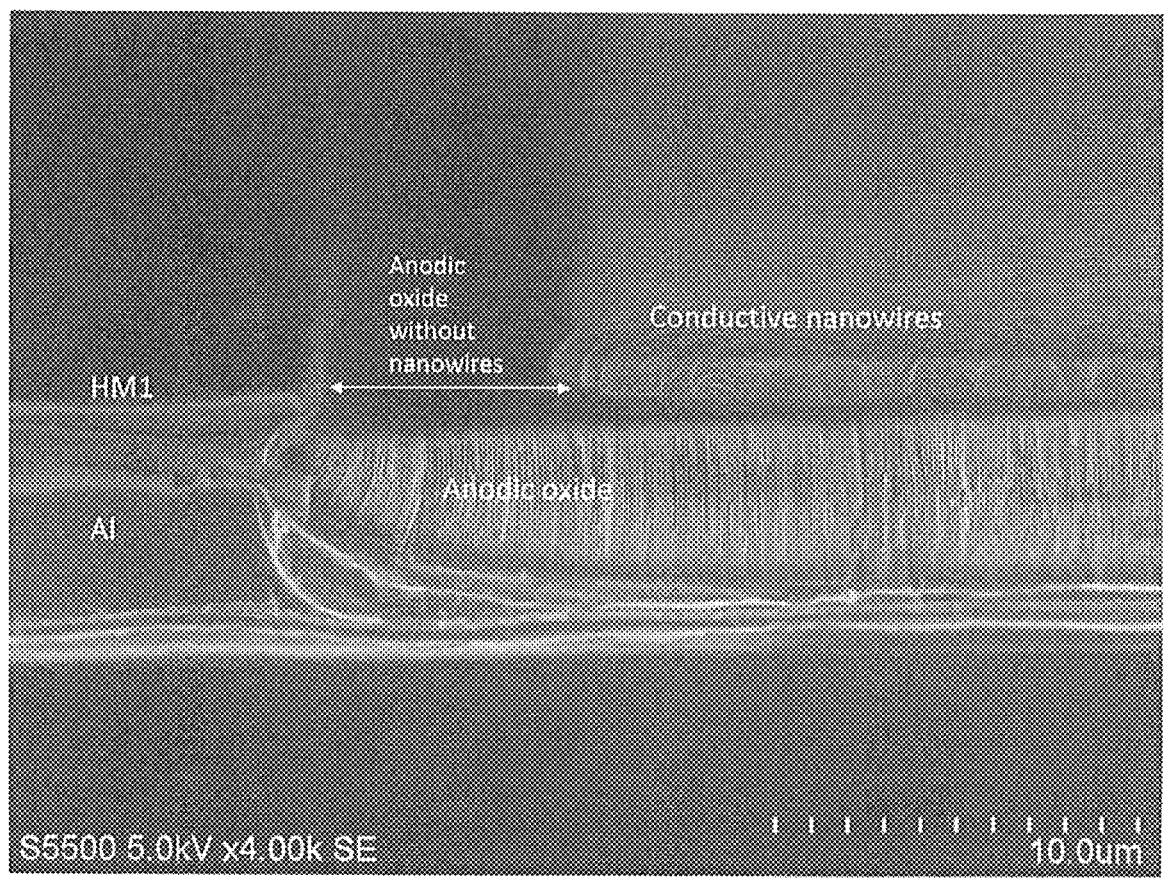
FIG. 17 is an SEM image of a cross-section view of an example structure according to an embodiment of the present invention.

FIG. 17 is a SEM image of a cross-section view of an example structure according to an embodiment of the present invention. Specifically, FIG. 17 shows a structure after the second hard mask has been removed but before the anodic oxide region has been dissolved. As shown, due to the use of the second hard mask, a lateral section of the anodic oxide region remains free of conductive wires. When the second hard mask is removed and the anodic oxide is dissolved, a trench is formed in the volume previously occupied by this lateral section of the anodic oxide region. Due to this trench surrounding the conductive wires, the structure is completely open from its sides, which significantly facilitates gas permeability and EIE deposition.

In an embodiment, after EIE deposition, the trench may be filled with an insulating material (polymer or oxide) creating a sidewall of the structure. As such, in an embodiment, the process may further comprise forming an isolation sidewall that abuts and encloses laterally the conductive wires. This may include dissolving a section of the anodic oxide region that surrounds the conductive wires, the anodic oxide region being free of conductive wires in the dissolved section; and forming the isolation sidewall inside a volume previously occupied by the dissolved section of the anodic oxide region.

As discussed above, the isolation sidewall creates an isolating wall around the structure and results in several advantages. First, using the isolation sidewall, the structure may be formed in a substrate housing an array of such structure. The structures of the array would be delimited by the isolation sidewalls. Dicing of the array can be done along the isolation sidewalls. When the cut occurs along the isolation sidewall, the lateral side of the resulting structure is electrically insulated from the inner of the structure. In addition, the isolation sidewall acts as a stress buffer during the dicing process. Moreover, the isolation sidewall acts as a lateral passivation layer, sealing the structure and preventing infiltrations due to further processing steps after dicing (e.g., molding, soldering, etc.)

In another embodiment, a trench surrounding the conductive wires (which may be filled to create an isolation sidewall) may be created without the use of a second hard mask. Specifically, this embodiment relies on the fact that in the anodization of the anodizable layer (as defined by the first hard mask), the pores created near the edges of the first hard mask may be unopen (i.e., the pores do not extend all the way to the anodic etch stop layer) or only partially open (i.e., the pores extend but not over the full pore diameter). The anodizable layer thus forms a residual ledge in the region defined by these pores. In one implementation, some of the side pores that form the residual ledge are etched after anodization to fully open them and use them to grow conductive wires. In another implementation, however, the side pores may be left unetched after anodization. The effect of this is that current may not flow through these pores during the electroplating used for growing the conductive wires. Thus, no conductive wires grow in the side pores. The dissolution of the anodic oxide after the conductive wires are grown results in a trench in the region previously occupied by the side pores. As discussed above, this trench may be filled to create an isolation sidewall.

Figure 13G:
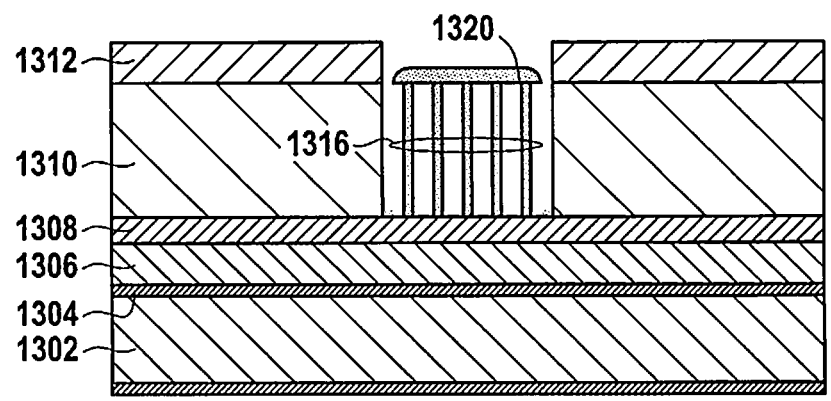

The manufacturing process described above may be repeated to form a multi-stack structure. Specifically, starting from a structure as shown in FIG. 13F or 13G, a second anodic oxide template may be formed over the capping layer. Then, conductive wires may be grown within the second anodic oxide template and a second capping layer may be deposited to cap the conductive wires. The second anodic oxide template is finally dissolved. This multi-stack process would be aided, and the resulting structure's capacitive density would be improved, by the capping layer being of the same material as the anodic etch stop layer 1308 (e.g., tungsten).

Figure 14A:
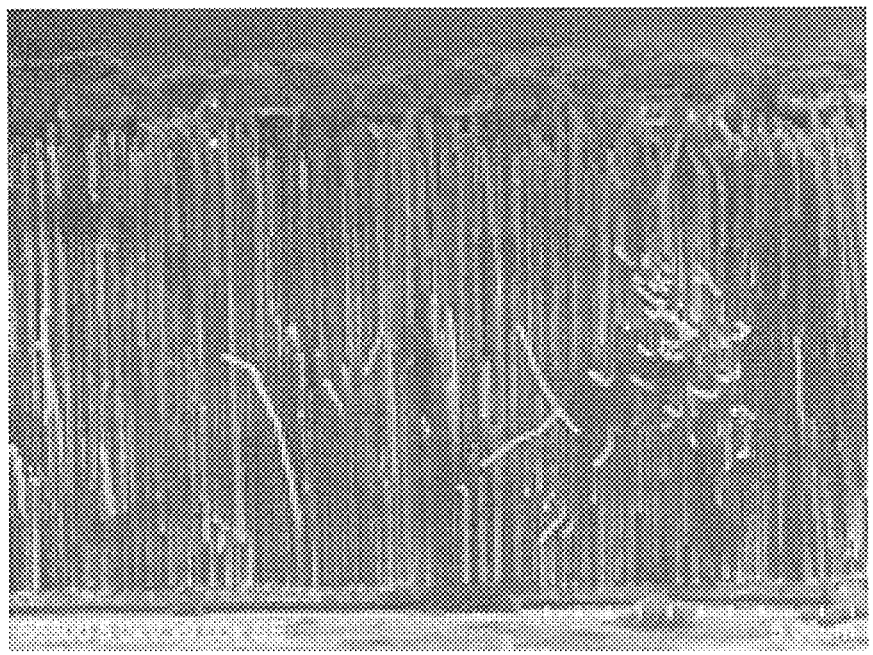
FIGS. 14A-14B are SEM images of a cross-section view and a top view respectively of an example structure according to an embodiment of the present invention.
Figure 14B:
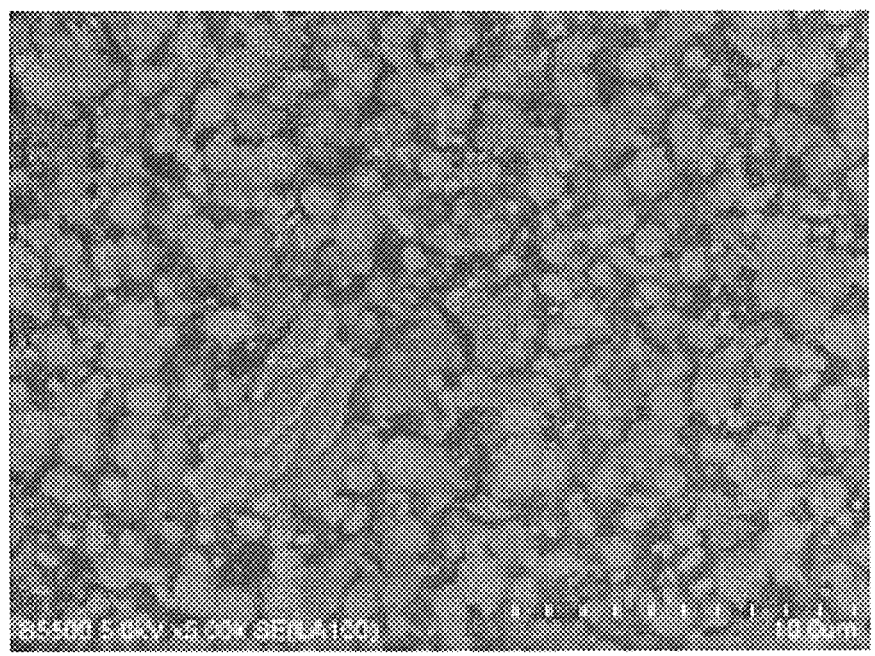

FIGS. 14A-14B are SEM images of a cross-section view and a top view respectively of a partially-capped structure fabricated in accordance with the above described process.

Figure 15A:
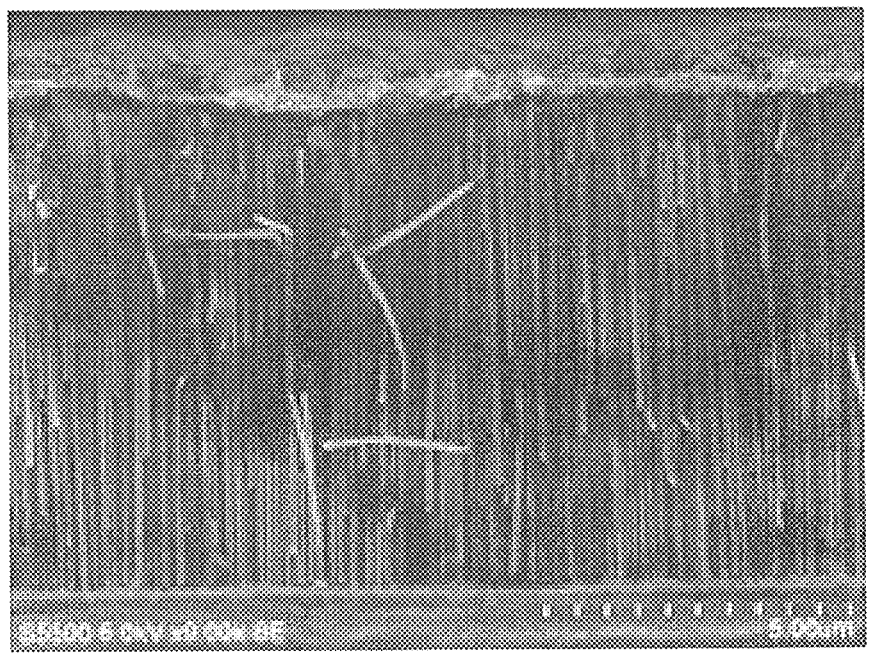
FIGS. 15A-15B are SEM images of a cross-section view and a top view respectively of an example structure according to an embodiment of the present invention.
Figure 15B:
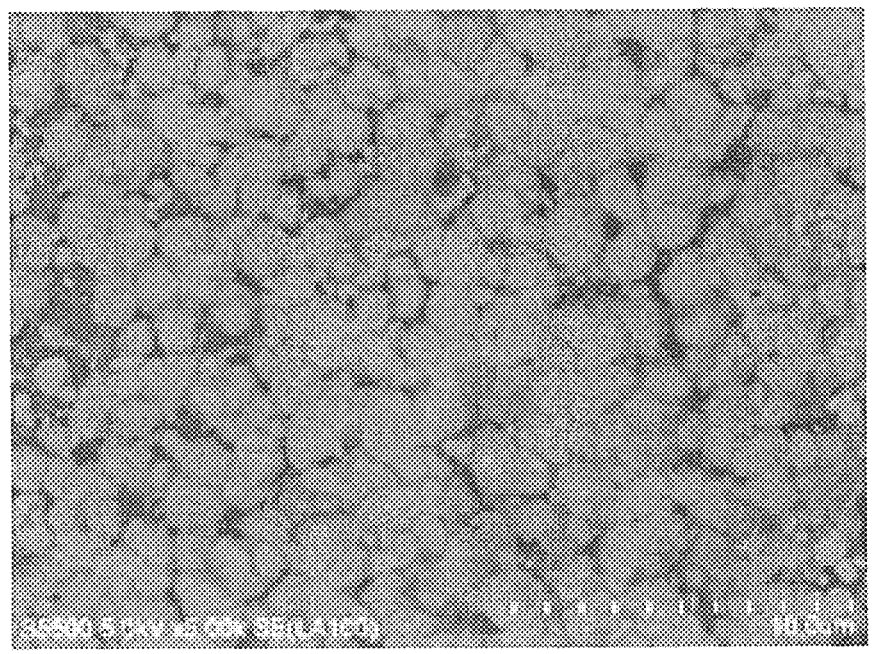

FIGS. 15A-15B are SEM images of a cross-section view and a top view respectively of a continuously-capped structure fabricated in accordance with the above described process.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A structure, comprising:
a first conductive layer;
first conductive wires having first ends that contact the first conductive layer and second ends that protrude from the first conductive layer;
a first lateral bridge layer that connects laterally a number of the first conductive wires to provide a substantially uniform spacing between the first conductive wires, wherein the first lateral bridge layer comprises a capping layer that caps the second ends of at least some of the first conductive wires, the capping layer being of a different material than the first conductive wires; and
an electrode-insulator-electrode stack or an insulator-electrode stack that coats the first conductive wires and the capping layer.

2. The structure of claim 1, wherein the first lateral bridge layer comprises lateral extensions that connect laterally at least some of the first conductive wires via their outer walls.

3. The structure of claim 1, wherein the capping layer is a continuous, semi-continuous, or discontinuous layer.

4. The structure of claim 1, further comprising:
second conductive wires having first ends that contact the capping layer and second ends that protrude from the capping layer; and
a second lateral bridge layer that connects laterally a number of the second conductive wires to provide a substantially uniform spacing between the second conductive wires.

5. The structure of claim 4, wherein the second lateral bridge comprises:
a capping layer that caps the second ends of at least some of the second conductive wires; or
lateral extensions that connect laterally at least some of the second conductive wires via their outer walls.

6. The structure of claim 4, wherein the electrode-insulator-electrode stack or an insulator-electrode stack further coats the second conductive wires.

7. The structure of claim 1, further comprising:
an isolation sidewall that abuts and encloses laterally the first conductive wires.

8. A method of manufacturing an electronic product, the method comprising:
forming an anodic etch stop layer on a substrate;
forming an anodizable layer on the anodic etch stop layer;
anodizing the anodizable layer to form an anodic oxide region having pores;
forming, inside pores of the anodic oxide region, conductive wires having first ends that contact the anodic etch stop layer and second ends that protrude from the anodic etch stop layer;
forming a lateral bridge layer that connects laterally a number of the conductive wires, wherein forming the lateral bridge layer comprises forming, on a top surface of the anodic oxide region, a capping layer that caps the second ends of at least some of the conductive wires, the capping layer being of a different material than the conductive wires;
selectively dissolving the anodic oxide region; and
forming an electrode-insulator-electrode stack or an insulator-electrode stack on the conductive wires and the capping layer.

9. The method of claim 8, further comprising:
depositing a first hard mask above the anodizable layer;
patterning the first hard mask to define a section of the anodizable layer; and
anodizing the section of the anodizable layer defined by the first hard mask to form the anodic oxide region.

10. The method of claim 9, further comprising:
depositing a second hard mask on the anodic oxide region;
patterning the second hard mask to define a section of the anodic oxide region; and
forming the conductive wires inside pores of the anodic oxide region that fall within the section of the anodic oxide region defined by the second hard mask.

11. The method of claim 8, wherein the anodic oxide region includes lateral porous branches that connect adjacent pores of the anodic oxide region, and wherein forming the lateral bridge layer comprises forming lateral extensions, inside the lateral porous branches, the lateral extensions connecting laterally at least some of the conductive wires via their outer walls.

12. The method of claim 8, wherein selectively dissolving the anodic oxide region comprises controlling a selective etching process of the anodic oxide region to reduce etching at the interface of the anodic etch stop layer and the conductive wires.

13. The method of claim 8, further comprising:
forming an isolation sidewall that abuts and encloses laterally the conductive wires.

14. The method of claim 13, further comprising:
dissolving a section of the anodic oxide region that surrounds the conductive wires, the anodic oxide region being free of conductive wires in the dissolved section; and
forming the isolation sidewall inside a volume previously occupied by the dissolved section of the anodic oxide region.

15. The method of claim 14, wherein the section of the anodic oxide region that surrounds the conductive wires includes pores that do not fully extend to the anodic etch stop layer at the time that section is dissolved.

* * * * *